(12) United States Patent
Kim

(10) Patent No.: US 7,715,506 B2
(45) Date of Patent: May 11, 2010

(54) BROADCAST SIGNAL RECEIVER AND CONTROL METHOD THEREOF

(75) Inventor: Dong-Won Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 915 days.

(21) Appl. No.: 11/409,048

(22) Filed: Apr. 24, 2006

(65) Prior Publication Data
US 2006/0252395 A1 Nov. 9, 2006

(30) Foreign Application Priority Data
May 4, 2005 (KR) .............. 10-2005-0037647

(51) Int. Cl.
H03D 1/04 (2006.01)
H04B 17/00 (2006.01)

(52) U.S. Cl. .................. 375/346; 455/226.3

(58) Field of Classification Search ......... 375/316–317, 375/345; 455/3.02, 226.1, 226.2, 226.3, 455/232.1, 234.2, 234.1, 323
See application file for complete search history.

(56) References Cited

U.S. PATENT DOCUMENTS

| | | | | |
|---|---|---|---|---|
| 5,638,141 A | * | 6/1997 | Bae et al. | ............ 348/735 |
| 5,999,578 A | * | 12/1999 | Ha | ............ 375/345 |
| 6,725,026 B2 | | 4/2004 | Jang | |
| 7,280,812 B2 | * | 10/2007 | Demir et al. | ............ 455/232.1 |
| 7,359,678 B2 | * | 4/2008 | Hayashi et al. | ............ 455/84 |
| 2003/0064965 A1 | | 4/2003 | Richter | |
| 2004/0259516 A1 | * | 12/2004 | Hwang et al. | ............ 455/234.1 |

FOREIGN PATENT DOCUMENTS

| KR | 10-2001-0003478 | 1/2001 |
|---|---|---|
| KR | 2001-0003478 | 1/2001 |
| KR | 10-2001-0062835 | 7/2001 |
| KR | 2001-0062835 | 7/2001 |

* cited by examiner

*Primary Examiner*—Khanh C Tran
(74) *Attorney, Agent, or Firm*—Roylance, Abrams, Berdo & Goodman, L.L.P.

(57) ABSTRACT

The present invention relates to a broadcast signal receiver comprising a low noise amplifier for receiving an RF signal and selectively amplifying the received RF signal; a tuner for tuning the RF signal selectively amplified by the low noise amplifier to a predetermined channel; a signal analyzer for demodulating a signal output from the tuner and calculating a signal-to-noise ratio of the demodulated signal; and a controller for determining the strength of the signal output from the tuner, and controlling a selective amplifying operation of the low noise amplifier on the basis of the determined signal strength and the signal-to-noise ratio. Thus, the present invention provides a broadcast signal receiver and a control method thereof, which prevents poor picture quality when the LNA is turned on due to the RF signal having a weak electric field.

14 Claims, 2 Drawing Sheets

BROADCAST SIGNAL RECEIVER AND CONTROL METHOD THEREOF

CROSS-REFERENCE TO RELATED APPLICATIONS

This application claims the benefit under 35 U.S.C. §119 (a) of Korean Patent Application No. 2005-0037647, filed May 4, 2005, in the Korean Intellectual Property Office, the entire disclosure of which is hereby incorporated by reference.

BACKGROUND OF THE INVENTION

1. Field of the Invention

The present invention relates to a broadcast signal receiver and a control method thereof. More particularly, the present invention relates to a broadcast signal receiver comprising a low noise amplifier (LNA) and a control method thereof.

2. Description of the Related Art

A problem with conventional broadcast signal receivers is that receiver sensitivity is deteriorated when a radio frequency (RF) signal with a weak electric field is tuned by a tuner.

To solve this problem, a broadcast signal receiver has been proposed, in which receiver sensitivity is determined based on an automatic gain control (AGC) signal. A LNA is controlled to turn on in accordance with the determined receiver sensitivity, so as to maintain sufficient receiver sensitivity despite the RF signal having a weak electric field.

However, in the conventional broadcast signal receiver, if the LNA is turned on when the RF signal is received with too much noise, the noise being amplified with the RF signal is likely to reach a critical level beyond which poor picture quality will result.

Accordingly, there is a need for an improved broadcast signal receiver that controls a LNA to maintain sufficient receiver sensitivity while preventing poor picture quality.

SUMMARY OF THE INVENTION

An aspect of the present invention is to address at least the above problems and/or disadvantages and to provide at least the advantages described below. Accordingly, an aspect of the present invention is to provide a broadcast signal receiver and a control method thereof, which prevents poor picture quality while the LNA is controlled to be turned on due to the received RF signal having a weak electric field.

Another aspect of the present invention is achieved by providing a broadcast signal receiver comprising a LNA to receive a RF signal from an antenna and selectively amplify the received RF signal. A tuner is provided to tune the amplified RF signal in correspondence to a predetermined channel. A signal analyzer is provided to demodulate a signal output from the tuner and to calculate a signal-to-noise ratio of the demodulated signal. A controller is provided to determine the strength of the tuner's output signal, and to control a selective amplifying operation of the LNA on the basis of the determined signal strength and the signal-to-noise ratio.

According to an yet another aspect of the present invention, the tuner comprises an automatic gain controller to compare the tuned output signal with a predetermined critical level and to generate an automatic gain control signal based on the compared result. The tuner varies a gain between the tuner's input and output signals on the basis of the automatic gain control signal. The controller determines the strength of the tuner's output signal on the basis of the automatic gain control signal.

According to still another aspect of the present invention, the signal analyzer comprises a channel demodulator to demodulate the signal output from the tuner. Further, the signal analyzer calculates the signal-to-noise ratio on the basis of the channel demodulator's output signal.

According to another aspect of the present invention, the controller compares the automatic gain control signal and the signal-to-noise ratio with respective reference levels. The controller controls the low noise amplifier to turn on when the automatic gain control signal is lower than its corresponding reference level and the signal-to-noise ratio is higher than its corresponding reference level. The controller controls the low noise amplifier to turn off when the automatic gain control signal is equal to or higher than its corresponding reference level and the signal-to-noise ratio is equal to or lower than its corresponding reference level.

Another aspect of the present invention is achieved by providing a method of controlling a broadcast signal receiver comprising a low noise amplifier to selectively amplify an external RF signal. The method comprises tuning the RF signal selectively amplified by the low noise amplifier to a predetermined channel; calculating a signal-to-noise ratio of the tuned signal; determining the strength of the tuned signal, and controlling a selective amplifying operation of the low noise amplifier on the basis of the determined signal strength and the signal-to-noise ratio.

According to still another aspect of the present invention, the method further comprises comparing the tuned signal with a predetermined critical level and generating an automatic gain control signal based on the compared result. Further, controlling the selective amplifying operation of the low noise amplifier comprises determining the strength of the tuned signal on the basis of the automatic gain control signal.

According to yet another aspect of the present invention, the method further comprises demodulating the tuned signal, wherein calculating the signal-to-noise ratio comprises calculating the signal-to-noise ratio on the basis of the demodulated signal.

According to another aspect of the present invention, controlling the selective amplifying operation of the low noise amplifier comprises comparing the automatic gain control signal and the signal-to-noise ratio with respective reference levels. The low noise amplifier is turned on when the automatic gain control signal is lower than its corresponding reference level and the signal-to-noise ratio is higher than its corresponding reference level. The low noise amplifier is turned off when the automatic gain control signal is equal to or higher than its corresponding reference level and the signal-to-noise ratio is equal to or lower than its corresponding reference level.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features, and advantages of certain embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
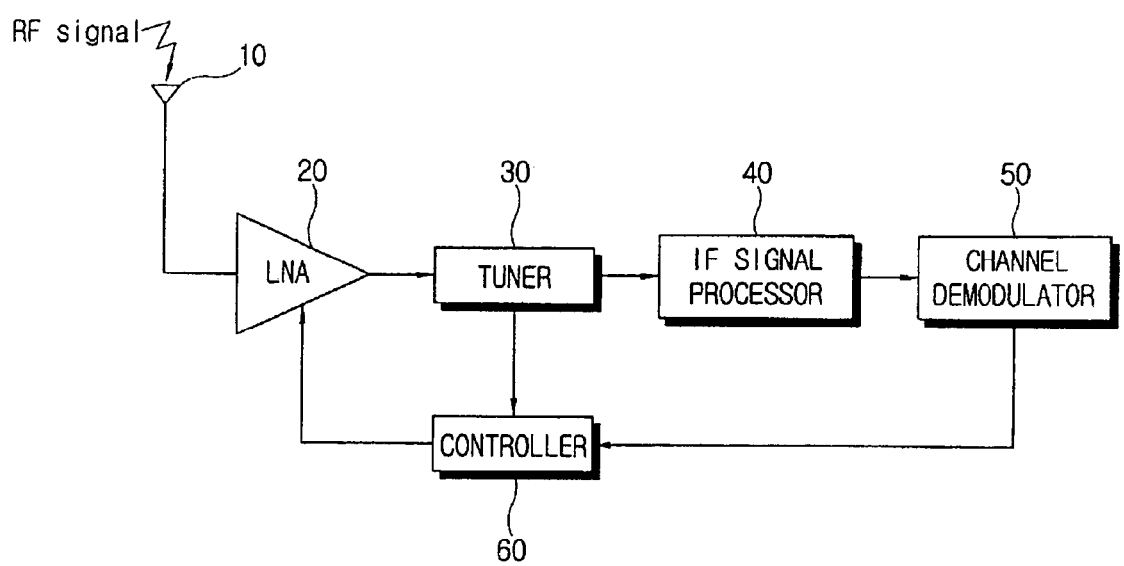
FIG. 1 is a control block diagram of a broadcast signal receiver according to an exemplary embodiment of the present invention.

FIG. 1 is a control block diagram of a broadcast signal receiver according to an exemplary embodiment of the present invention. As shown therein, the broadcast signal receiver includes an antenna 10, a low noise amplifier (LNA) 20, a tuner 30, an intermediate frequency (IF) signal processor 40, a channel demodulator 50, and a controller 60.

The LNA 20 is controlled by the controller 60 to toggle an amplifying operation. The LNA 20 is provided with an internal switch to toggle the amplifying operation. Therefore, a radio frequency (RF) signal received from the antenna 10 is passed through the LNA 20 either with or without amplification.

The LNA 20 is designed to have a minimized noise factor (NF) by taking into consideration an operating point and a matching point. Preferably, the LNA 20 has a NF of 1.5 through 2.5.

The tuner 30 tunes to the RF signal of a plurality of RF signals that corresponds to a predetermined channel selected by a user. The RF signal is passed through the LNA 20 either with or without amplification. The tuner outputs a tuned RF signal. The tuner 30 further includes an amplifier (not shown) for selectively amplifying the input RF signal to a predetermined level.

Further, the tuner 30 includes an automatic gain controller (not shown) comparing the level of the output signal from the tuner 30 with a predetermined critical level, and generating an automatic gain control (AGC) signal based on the compared results. Thus, the tuner 30 adjusts a gain between the input signal and the output signal on the basis of the AGC signal from the automatic gain controller.

The automatic gain controller can be realized by a simple circuit to detect a direct current (DC) component in the tuner's 30 output signal, compare the detected DC component received from a comparator (not shown) with the critical level, and output the corresponding AGC signal to the tuner 30. Thus, the tuner 30 varies the gain between the input signal and the output signal. The automatic gain controller prevents signal saturation by decreasing the gain when the input signal is strong. Further, the gain is increased when the input signal is weak. Thereby, the signal is maintained at a predetermined level. In other words, the automatic gain controller generates a low AGC signal when the input RF signal has a strong electric field, and generates a high AGC signal when the input RF signal has a weak electric field.

Preferably, the RF signal input to the tuner 30 has a frequency in the range of about 50 to 900 MHz. The signal output from the tuner 30 is converted into an intermediate frequency (IF).

Preferably, the IF signal processor 40 includes a band pass surface acoustic wave (SAW) filter (not shown) to limit the band of the IF signal output from the tuner 30; a buffer (not shown), and an amplifier (not shown). The IF signal processor 40 processes the signal output from the tuner 30 in order to achieve a desired frequency characteristic. Preferably, the IF signal processor 40 includes an IF auto gain controller (not shown) to generate an IF-AGC signal. The gain between the input IF signal and the output IF signal is adjusted on the basis of the generated IF-AGC signal.

The channel demodulator 50 includes an analog/digital (A/D) converter (not shown) to convert an analog signal output from the IF signal processor 40 into a digital signal. Further, the channel demodulator 50 demodulates the digital signal and corrects for any error in the signal.

The channel demodulator 50 outputs a signal comprising moving picture experts group (MPEG) transport stream (TS) data to an MPEG decoder. The MPEG decoder decodes the input signal, thereby outputting a picture signal, a sound signal, and data.

Further, the channel demodulator 50 analyzes the demodulated signal and calculates a signal to noise ratio (SNR). Preferably, the SNR is calculated using a software algorithm.

The SNR is calculated by an equation expressed as 'signal power/noise power,' and is used as an index for indicating the effect or the level of noise. As the SNR increases, the effect of noise becomes smaller.

The controller 60 receives the AGC signal from the tuner 30 and the SNR from the channel demodulator 50. Further, the controller 60 determines the strength of and the noise contained in the input signal, which is used when controlling the selective amplifying operation of the LNA 20.

The controller 60 can be realized by a central processing unit (CPU) having input/output pins. Preferably, the input/output pins are general purpose input/output (GPIO) pins.

The controller 60 compares the AGC signal and the SNR that is input to the GPIO pins against predetermined preset reference levels. The controller 60 further determines if the RF signal has a weak electric field and whether the RF signal is input with too much noise, so as to output a corresponding control signal to the LNA 20.

If the controller 60 determines that the RF signal has a weak electric field with an acceptable level of noise, LNA 20 is turned on. The noise is considered acceptable when the AGC signal is lower than its reference level and the SNR is higher than its reference level. However, if the controller 60 determines that the RF signal has the weak electric field with a SNR lower than its reference level, the controller 60 turns off LNA 20. On the other hand, when the AGC signal is higher than its reference level, the controller 60 turns off the LNA 20 regardless of the SNR. The reference levels for determining a weak electric field and SNR can be varied according to the characteristics of the broadcast signal receiver.

Thus, the broadcast signal receiver according to an exemplary embodiment of the present invention determines the selective operation of the LNA 20 at least on basis of the SNR. Thereby, a displayed picture is prevented from having poor quality when the LNA 20 is turned on in response to the RF signal being received with a weak electric field.

Below, a method of controlling the broadcast signal receiver according to an exemplary embodiment of the present invention will be described with reference to FIG. 2.

Figure 2:
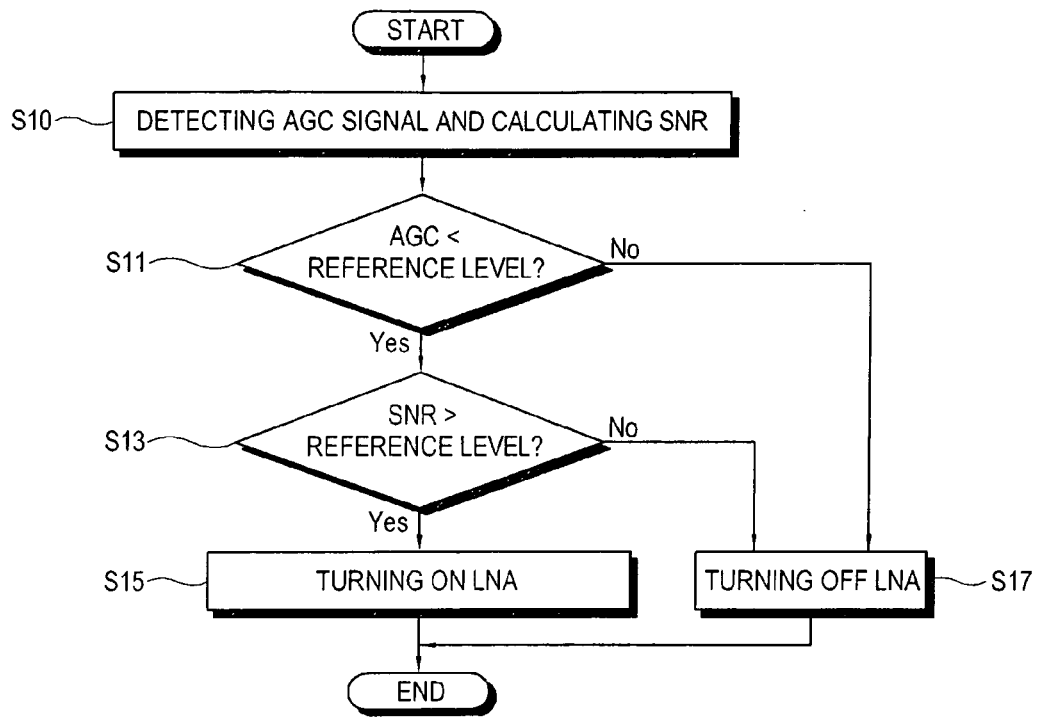
FIG. 2 is a control flowchart of the broadcast signal receiver according to an exemplary embodiment of the present invention.

Referring to FIG. 2, at operation S10, the AGC signal for the tuner's 30 output signal is generated to control the gain between the input and output signals of the tuner 30. The SNR is calculated by the channel demodulator 50. Both the AGC signal and the SNR are input to the controller 60.

At operation S11, the controller 60 determines whether the electric field of the RF signal is weak or strong. The strength of the RF signal is determined on the basis of the AGC signal output from the tuner 30. The controller 60 determines whether the level of the AGC signal is lower or higher than a preset reference level, thereby determining whether the electric field of the RF signal is weak or strong.

The following table shows an example of RF signal strengths divided into fourteen levels with the corresponding electric field.

| Electric field (dBm) | −82 | −80 | −78 | −75 | −72 | −68 | −63 |
|---|---|---|---|---|---|---|---|
| Signal strength | 0 | 1 | 2 | 3 | 4 | 5 | 6 |
| Electric field (dBm) | −59 | −53 | −43 | −38 | −28 | −20 | −10 |
| Signal strength | 7 | 8 | 9 | 10 | 11 | 12 | 13 |

As shown in the table, the strength of the signal becomes weak in proportion to the electric field of the RF signal. Accordingly, the level of the tuner's 30 RF-AGC signal becomes lower. For example, the reference level can be set to −47 dBm. In this case, the controller 60 determines that the RF signal has a weak electric field when its electric field is lower than −47 dBm.

At operation S13, the controller 60 determines whether the SNR output from the channel demodulator 50 is at a level higher than a predetermined preset reference level. For example, the reference level can be set to 20 dB.

At operation S15, the controller 60 turns on the LNA 20 when it is determined from the AGC signal that the RF signal level is lower than −47 dBm and the SNR is higher than 20 dB. On the other hand, at operation S17, the controller 60 turns off the LNA 20 when it is determined that the RF signal level is not lower than −47 dBm and the SNR is not higher than 20 dB.

Thus, the broadcast signal receiver according to an exemplary embodiment of the present invention prevents a displayed picture from having poor quality. By contrast, a displayed picture can have poor quality if a signal with too much noise is amplified when the amplifying operation of the LNA 20 is controlled solely on the basis the RF signal's electric field. According to an exemplary embodiment of the present invention, the LNA 20 operates only when the SNR level is higher than a predetermined level, thus maintaining sufficient receiver sensitivity. Therefore, even when the RF signal has a weak electric field, the receiving performance of the broadcast signal receiver is prevented from being deteriorated due to the limited strength of the electric field.

In FIG. 2, the AGC signal is determined before the SNR. Alternatively, the determining order may be reversed.

As described above, the present invention provides a broadcast signal receiver and a control method thereof, which prevents a displayed picture from having poor quality while the LNA is turned on due to the electric field of the RF signal being weak.

While the invention has been shown and described with reference to certain embodiments thereof, it will be understood by those skilled in the art that various changes in form and details may be made therein without departing from the spirit and scope of the invention as defined by the appended claims.

What is claimed is:

1. A broadcast signal receiver comprising:
    a low noise amplifier for receiving a RF signal and selectively amplifying the received RF signal;
    a tuner for tuning the RF signal selectively amplified by the low noise amplifier;
    a signal analyzer for demodulating a signal output from the tuner and calculating a signal-to-noise ratio of the demodulated signal; and
    a controller for determining a strength of the signal output from the tuner, and controlling a selective amplifying operation of the low noise amplifier on the basis of the determined signal strength and the signal-to-noise ratio;
    wherein the tuner comprises an automatic gain controller for comparing the signal output from the tuner with a predetermined critical level and generating an automatic gain control signal based on the compared result;
    wherein the controller compares the automatic gain control signal and the signal-to-noise ratio with respective reference levels, and turns on the low noise amplifier when the automatic gain control signal is lower than its reference level and the signal-to-noise ratio is higher than its reference level.

2. The broadcast signal receiver according to claim 1, wherein the tuner varies a gain between input and output signals of the tuner on the basis of the automatic gain control signal.

3. The broadcast signal receiver according to claim 1, wherein the controller determines the strength of the signal output from the tuner on the basis of the automatic gain control signal.

4. The broadcast signal receiver according to claim 1, wherein the tuner comprises an automatic gain controller for comparing the signal output from the tuner with a predetermined critical level and generating an automatic gain control signal based on the compared result,
    the tuner varies a gain between input and output signals of the tuner on the basis of the automatic gain control signal, and
    the controller determines the strength of the signal output from the tuner on the basis of the automatic gain control signal.

5. The broadcast signal receiver according to claim 1, wherein the signal analyzer comprises a channel demodulator for demodulating the signal output from the tuner, and calculating the signal-to-noise ratio on the basis of the signal output from the channel demodulator.

6. The broadcast signal receiver according to claim 1, wherein the controller compares the automatic gain control signal and the signal-to-noise ratio with respective reference levels, and turns off the low noise amplifier when the automatic gain control signal is equal to or higher than its reference level and the signal-to-noise ratio is equal to or lower than its reference level.

7. The broadcast signal receiver according to claim 1, wherein the controller compares the automatic gain control signal and the signal-to-noise ratio with respective reference levels, turns on the low noise amplifier when the automatic gain control signal is lower than its reference level and the signal-to-noise ratio is higher than its reference level, and turns off the low noise amplifier when the automatic gain control signal is equal to or higher than its reference level and the signal-to-noise ratio is equal to or lower than its reference level.

8. The broadcast signal receiver according to claim 1, wherein the RF signal selectively amplified by the low noise amplifier is tuned to a predetermined channel.

9. A method of controlling a broadcast signal receiver comprising a low noise amplifier for selectively amplifying a RF signal, the method comprising:
- tuning the RF signal selectively amplified by the low noise amplifier;
- calculating a signal-to-noise ratio of the signal output from the tuner;
- determining a strength of the signal output from the tuner, and controlling a selective amplifying operation of the low noise amplifier on the basis of the determined signal strength and the signal-to-noise ratio;
- wherein the method further comprises the step of comparing the signal output from the tuner with a predetermined critical level and generating an automatic gain control signal based on the compared result;
- wherein the controlling the selective amplifying operation of the low noise amplifier comprises comparing the automatic gain control signal and the signal-to-noise ratio with respective reference levels, and turning on the low noise amplifier when the automatic gain control signal is lower than its reference level and the signal-to-noise ratio is higher than its reference level.

10. The method of controlling a broadcast signal receiver according to claim 9, wherein the controlling the selective amplifying operation of the low noise amplifier comprises determining the strength of the signal output from the tuner on the basis of the automatic gain control signal.

11. The method of controlling a broadcast signal receiver according to claim 9, further comprising demodulating the signal output from the tuner,
wherein the calculating the signal-to-noise ratio comprises calculating the signal-to-noise ratio on the basis of the demodulated signal.

12. The method of controlling a broadcast signal receiver according to claim 9, wherein the controlling the selective amplifying operation of the low noise amplifier comprises comparing the automatic gain control signal and the signal-to-noise ratio with respective reference levels, and turning off the low noise amplifier when the automatic gain control signal is equal to or higher than its reference level and the signal-to-noise ratio is equal to or lower than its reference level.

13. The method of controlling a broadcast signal receiver according to claim 9, wherein the controlling the selective amplifying operation of the low noise amplifier comprises comparing the automatic gain control signal and the signal-to-noise ratio with respective reference levels, turning on the low noise amplifier when the automatic gain control signal is lower than its reference level and the signal-to-noise ratio is higher than its reference level, and turning off the low noise amplifier when the automatic gain control signal is equal to or higher than its reference level and the signal-to-noise ratio is equal to or lower than its reference level.

14. The method of controlling a broadcast signal receiver according to claim 9, wherein tuning the RF signal selectively amplified by the low noise amplifier is in accordance to a predetermined channel.

* * * * *